US009039411B2

(12) United States Patent
Kadobe et al.

(10) Patent No.: US 9,039,411 B2
(45) Date of Patent: May 26, 2015

(54) THERMAL TREATMENT APPARATUS

(75) Inventors: Masato Kadobe, Iwate (JP); Naomi Onodera, Iwate (JP); Kazuhiko Kato, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 453 days.

(21) Appl. No.: 13/409,426

(22) Filed: Mar. 1, 2012

(65) Prior Publication Data

US 2012/0231407 A1 Sep. 13, 2012

(30) Foreign Application Priority Data

Mar. 7, 2011 (JP) .................................. 2011-049194

(51) Int. Cl.
| | |
|---|---|
| F27D 1/00 | (2006.01) |
| F27D 11/00 | (2006.01) |
| F27B 5/14 | (2006.01) |
| C23C 16/44 | (2006.01) |
| C23C 16/455 | (2006.01) |
| C23C 16/46 | (2006.01) |
| H01L 21/02 | (2006.01) |
| H01L 21/22 | (2006.01) |
| H01L 21/324 | (2006.01) |
| H01L 21/67 | (2006.01) |
| C23C 16/34 | (2006.01) |
| C23C 16/30 | (2006.01) |
| F27B 17/00 | (2006.01) |

(52) U.S. Cl.
CPC ............ *C23C 16/345* (2013.01); *C23C 16/303* (2013.01); *C23C 16/46* (2013.01); *F27B 17/0025* (2013.01); *H01L 21/67109* (2013.01)

(58) Field of Classification Search
None
See application file for complete search history.

(56) References Cited

U.S. PATENT DOCUMENTS

| | | | | | |
|---|---|---|---|---|---|
| 3,055,741 | A | * | 9/1962 | MacInnis | 117/77 |
| 4,950,870 | A | * | 8/1990 | Mitsuhashi et al. | 219/390 |
| 5,320,680 | A | * | 6/1994 | Learn et al. | 118/724 |
| 5,429,498 | A | * | 7/1995 | Okase et al. | 432/152 |
| 5,458,685 | A | * | 10/1995 | Hasebe et al. | 118/724 |
| 5,478,397 | A | * | 12/1995 | Shibata et al. | 118/724 |
| 5,484,484 | A | * | 1/1996 | Yamaga et al. | 118/719 |
| 5,507,639 | A | * | 4/1996 | Monoe | 432/77 |
| 5,525,057 | A | * | 6/1996 | Monoe | 432/77 |
| 5,616,264 | A | * | 4/1997 | Nishi et al. | 219/494 |
| 5,651,670 | A | * | 7/1997 | Okase et al. | 432/5 |

(Continued)

FOREIGN PATENT DOCUMENTS

| | | |
|---|---|---|
| JP | 2000-068214 | 3/2000 |
| JP | 2002-043226 | 2/2002 |

(Continued)

*Primary Examiner* — Gregory Huson
*Assistant Examiner* — Eric Gorman
(74) *Attorney, Agent, or Firm* — IPUSA, PLLC

(57) ABSTRACT

A disclosed thermal treatment apparatus includes a supporting member where plural substrates are supported in the form of shelves; a reaction tube that accommodates the supporting member within the reaction tube, and is provided with plural gas supplying pipes arranged in a side part of the reaction tube, thereby allowing a gas to flow into the reaction tube through the plural gas supplying pipes; and a first heating part that heats the plural substrates supported by the supporting member accommodated within the reaction tube, wherein the first heating part includes a slit that extends from a bottom end to a top end of the first heating part and allows the plural gas supplying pipes to go therethrough, and wherein an entire inner surface, except for the slit, of the heating part faces the side part of the reaction tube.

7 Claims, 8 Drawing Sheets

(56) References Cited

U.S. PATENT DOCUMENTS

| | | | |
|---|---|---|---|
| 5,662,469 A * | 9/1997 | Okase et al. | 432/6 |
| 6,005,225 A * | 12/1999 | Kowalski et al. | 219/390 |
| 6,241,822 B1 * | 6/2001 | Ide | 118/666 |
| 6,407,367 B1 * | 6/2002 | Ito et al. | 219/390 |
| 8,017,024 B2 * | 9/2011 | Kim et al. | 216/37 |
| 8,431,032 B2 * | 4/2013 | Kim et al. | 216/37 |
| 8,466,045 B2 * | 6/2013 | Gumpher et al. | 438/478 |
| 2001/0016306 A1 * | 8/2001 | Vader et al. | 432/2 |
| 2002/0025688 A1 * | 2/2002 | Kato | 438/758 |
| 2004/0168638 A1 * | 9/2004 | Ishii et al. | 118/724 |
| 2006/0021582 A1 * | 2/2006 | Saito et al. | 118/724 |
| 2007/0084406 A1 * | 4/2007 | Yudovsky et al. | 118/724 |
| 2007/0084408 A1 * | 4/2007 | Yudovsky et al. | 118/725 |
| 2007/0231757 A1 * | 10/2007 | Dip et al. | 431/174 |
| 2008/0035055 A1 * | 2/2008 | Dip et al. | 118/715 |
| 2008/0153314 A1 * | 6/2008 | Hayashida et al. | 438/795 |
| 2008/0173238 A1 * | 7/2008 | Nakashima et al. | 118/723 R |
| 2009/0014435 A1 * | 1/2009 | Hayashida et al. | 219/531 |
| 2009/0029486 A1 * | 1/2009 | Ueno et al. | 438/5 |
| 2009/0044746 A1 * | 2/2009 | Okamura | 118/58 |
| 2009/0136888 A1 * | 5/2009 | Nakao et al. | 432/152 |
| 2009/0191718 A1 * | 7/2009 | Nakashima et al. | 438/758 |
| 2010/0009079 A1 * | 1/2010 | Yamazaki et al. | 427/255.28 |
| 2010/0035437 A1 * | 2/2010 | Yamazaki et al. | 438/758 |
| 2010/0061871 A1 * | 3/2010 | Arai et al. | 418/55.1 |
| 2010/0212593 A1 * | 8/2010 | Takebayashi et al. | 118/725 |
| 2010/0278999 A1 * | 11/2010 | Onodera et al. | 427/8 |
| 2011/0210118 A1 * | 9/2011 | Hirochi et al. | 219/647 |
| 2011/0212623 A1 * | 9/2011 | Yokogawa et al. | 438/694 |
| 2012/0003825 A1 * | 1/2012 | Dip | 438/493 |
| 2012/0103256 A1 * | 5/2012 | Hasebe | 118/696 |
| 2012/0119337 A1 * | 5/2012 | Sasaki et al. | 257/632 |
| 2012/0214317 A1 * | 8/2012 | Murobayashi et al. | 438/782 |
| 2012/0220108 A1 * | 8/2012 | Hara et al. | 438/478 |
| 2012/0240857 A1 * | 9/2012 | Morozumi et al. | 118/725 |
| 2012/0260857 A1 * | 10/2012 | Takahashi et al. | 118/725 |
| 2012/0329002 A1 * | 12/2012 | Kobayashi et al. | 432/120 |
| 2014/0318457 A1 * | 10/2014 | Umezawa et al. | 118/725 |

FOREIGN PATENT DOCUMENTS

| | | |
|---|---|---|
| JP | 2007-088325 | 4/2007 |
| JP | 2008-172205 | 7/2008 |

* cited by examiner

THERMAL TREATMENT APPARATUS

CROSS-REFERENCE TO RELATED APPLICATION

The present application is based on Japanese Patent Application No. 2011-049194 filed with the Japanese Patent Office on Mar. 7, 2011, the entire contents of which are hereby incorporated herein by reference.

BACKGROUND OF THE INVENTION

1. Field of the Invention

The present invention relates to a thermal treatment apparatus that thermally treats a substrate such as a semiconductor wafer, specifically a batch-type thermal treatment apparatus.

2. Description of the Related Art

In a fabrication process of semiconductor devices, a batch-type thermal treatment apparatus, where plural substrates are arranged at predetermined intervals and thermally treated in a batch, is used. Such a thermal treatment apparatus is provided with a reaction tube that has a lower opening, a wafer supporting member that supports plural substrates at predetermined intervals and is accommodated within the reaction tube, and an outer heater that heats the substrates in the reaction tube.

According to the thermal treatment apparatus, the wafer supporting member that supports the plural substrates is transferred into the reaction tube; the substrates are heated by the outer heater; and a process gas is supplied into the reaction tube through a gas supplying nozzle. In such a manner, the plural substrates go through a thermal treatment depending on the process gas.

Patent Document 1: Japanese Patent Application Laid-Open Publication No. 2000-068214

SUMMARY OF THE INVENTION

In such a thermal treatment apparatus, when the gas supplying nozzle extends higher than an upper end of the wafer supporting member and supplies the process gas from an upper end opening of the gas supplying nozzle, the process gas may be decomposed while it flows from the upper end to a bottom end of the wafer supporting member, and may be depleted at a bottom end part of the wafer supporting member. In this case, the treatment is not uniformly carried out with respect to the substrates along a longitudinal direction of the wafer supporting member. In order to avoid such non-uniform treatment, the batch-type thermal treatment apparatus may be provided with plural gas supplying nozzles having different lengths or a gas supplying nozzle having plural holes at predetermined intervals along a longitudinal direction of the gas supplying nozzle. With these gas supplying nozzles, the process gas can be ejected toward the plural substrates in the wafer supporting member at various levels along the longitudinal direction of the wafer supporting member, thereby improving process uniformity (for example, Patent Document 1).

However, even in this case, because the process gas flows upward through the process gas supplying nozzle(s) and is heated within the gas supplying nozzle(s), the process gas ejected from the upper end of the gas supplying nozzle is heated at a higher temperature than the process gas ejected from the lower end of the gas supplying nozzle. Because of such temperature differences, process uniformity cannot be sufficiently improved.

In addition, when two source gases are used as the process gas to deposit a thin film on the substrates and one of the two source gases has a significantly lower decomposition temperature than the other, the source gas having a lower decomposition temperature may start to decompose at upper parts of the gas supplying nozzle. In this case, a deposit may be formed on an inner wall of the gas supplying nozzle or an inner surface of the reaction tube, so that a deposition rate of a film on the substrates or source usage efficiency is decreased. In addition, the deposit on the inner surface of the reaction tube may peel and fall on the substrates, and thus the substrates are contaminated. Therefore, frequent maintenance is necessary, thereby decreasing a production throughput.

The present invention has been made in view of the above, and is directed toward providing a thermal treatment apparatus where plural substrates to be treated are accommodated in the form of shelves, the thermal treatment apparatus being capable of reducing temperature differences of a process gas to be supplied to the plural substrates and suppressing decomposition or thermal excitation of the process gas before reaching the substrates.

According to an aspect of the present invention, there is provided a thermal treatment apparatus including a supporting member where plural substrates are supported in the form of shelves; a reaction tube that accommodates the supporting member within the reaction tube, and is provided with plural gas supplying pipes arranged in a side part of the reaction tube, thereby allowing a gas to flow into the reaction tube through the plural gas supplying pipes; and a first heating part that heats the plural substrates supported by the supporting member accommodated within the reaction tube, wherein the first heating part includes a slit that extends from a bottom end to a top end of the first heating part and allows the plural gas supplying pipes to go therethrough, and wherein an entire inner surface, except for the slit, of the heating part faces the side part of the reaction tube.

DETAILED DESCRIPTION OF THE PREFERRED EMBODIMENT

Figure 1:
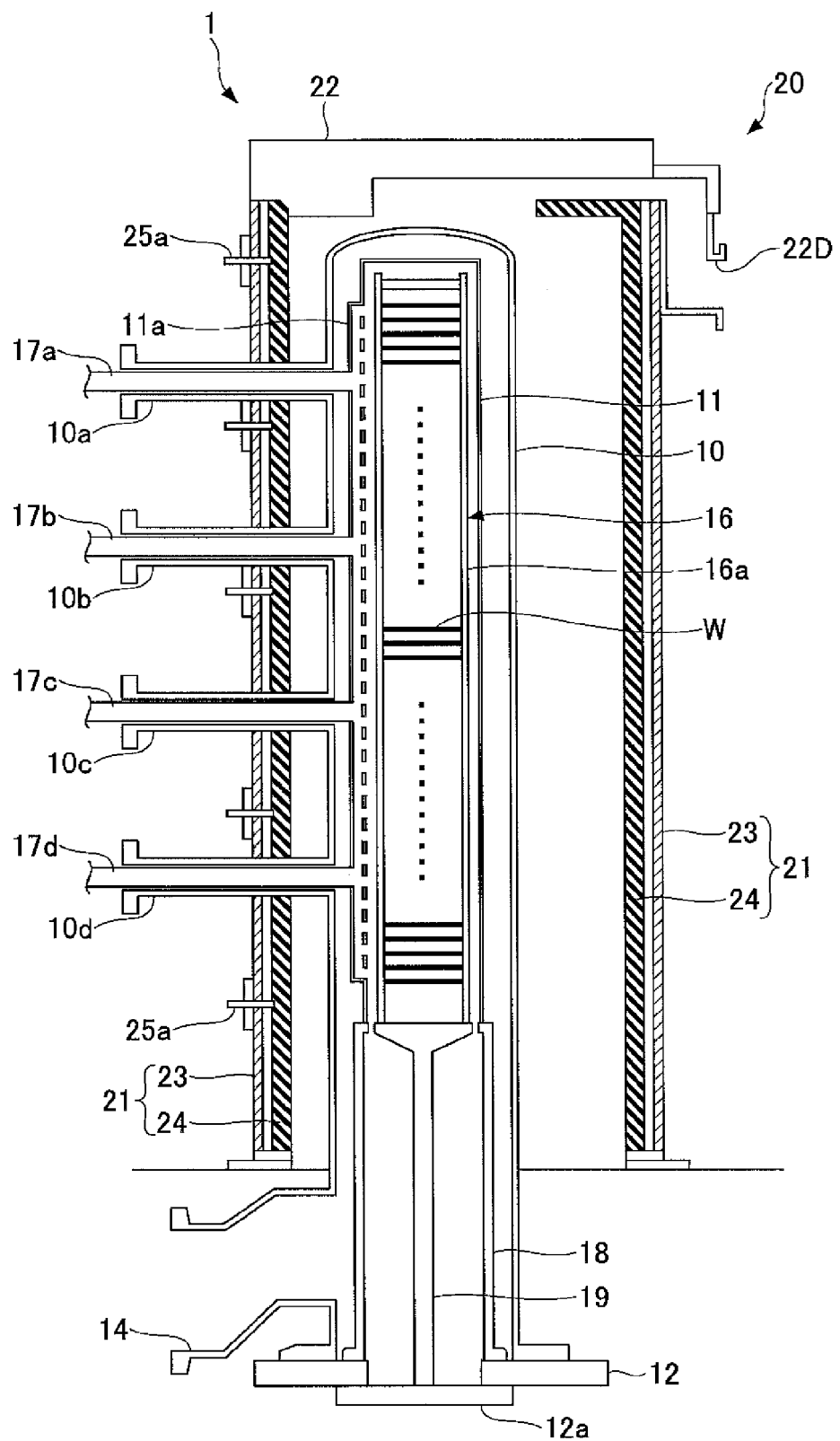
FIG. 1 is a schematic view of a thermal treatment apparatus according to an embodiment of the present invention.

According to an embodiment of the present invention, there is provided a thermal treatment apparatus where plural substrates to be treated are accommodated in the form of shelves, the thermal treatment apparatus being capable of reducing temperature differences of a process gas to be supplied to the plural substrates and suppressing decomposition or thermal excitation of the process gas before reaching the substrates.

Non-limiting, exemplary embodiments of the present invention will now be described with reference to the accompanying drawings. In the drawings, the same or corresponding reference symbols are given to the same or corresponding members or components. It is to be noted that the drawings are illustrative of the invention, and there is no intention to indicate scale or relative proportions among the members or components. Therefore, the specific size should be determined by a person having ordinary skill in the art in view of the following non-limiting embodiments.

Referring to FIG. 1, a thermal treatment apparatus 1 according to an embodiment of the present invention is provided with an outer tube 10 (reaction tube) having a shape of a cylinder with a closed top and a bottom opening, an inner tube 11 that is transferred into or out from the outer tube 10 through the bottom opening of the outer tube 10, a wafer supporting member 16 that supports plural wafers W in the form of shelves (or at predetermined vertical intervals) and is transferred into or out from the inner tube 11 through a bottom opening of the inner tube 11, and a heating part 20 that is arranged to surround the outer tube 10 and heats the wafers W supported by the wafer supporting member 16 through the outer tube 10 and the inner tube 11.

The outer tube 10 arranged outside the inner tube 11 is made of, for example, quartz glass, and is provided with plural (four in the illustrated example) guide tubes 10a, 10b, 10c, 10d arranged substantially in line along a longitudinal direction of the outer tube 10. Specifically, the outer tube 10 can be obtained by preparing a quartz glass cylinder with a closed top, making plural holes at predetermined intervals in a circumferential wall along a longitudinal direction of the quartz glass cylinder; and welding quartz glass tubes to the corresponding holes. In addition, gas supplying pipes 17a to 17d are inserted into the corresponding guide tubes 10a to 10d. In other words, the gas supplying pipes 17a to 17d are supported by the corresponding guide tubes 10a to 10d. The gas supplying pipes 17a to 17d are connected to corresponding pipes that are then connected to a gas supplying system (described later), so that a process gas from the gas supplying system is supplied into the inner tube 11 through the gas supplying pipes 17a to 17d (described later).

In addition, the outer tube 10 is provided below the guide tube 10d with an evacuation tube 14. The evacuation tube 14 is provided at a distal end with a flange, and an evacuation system is connected to the evacuation tube 14. With this configuration, the process gas is supplied into the inner tube 11 through the gas supplying pipes 17a to 17d, flows over upper surfaces of the wafers W into one or more opening(s) or slit(s) (not shown) provided in the inner tube 11, and then is evacuated from the evacuation tube 14. In addition, the outer tube 10 is fixed on a supporting plate 12 via a sealing member (not shown).

Figure 2:
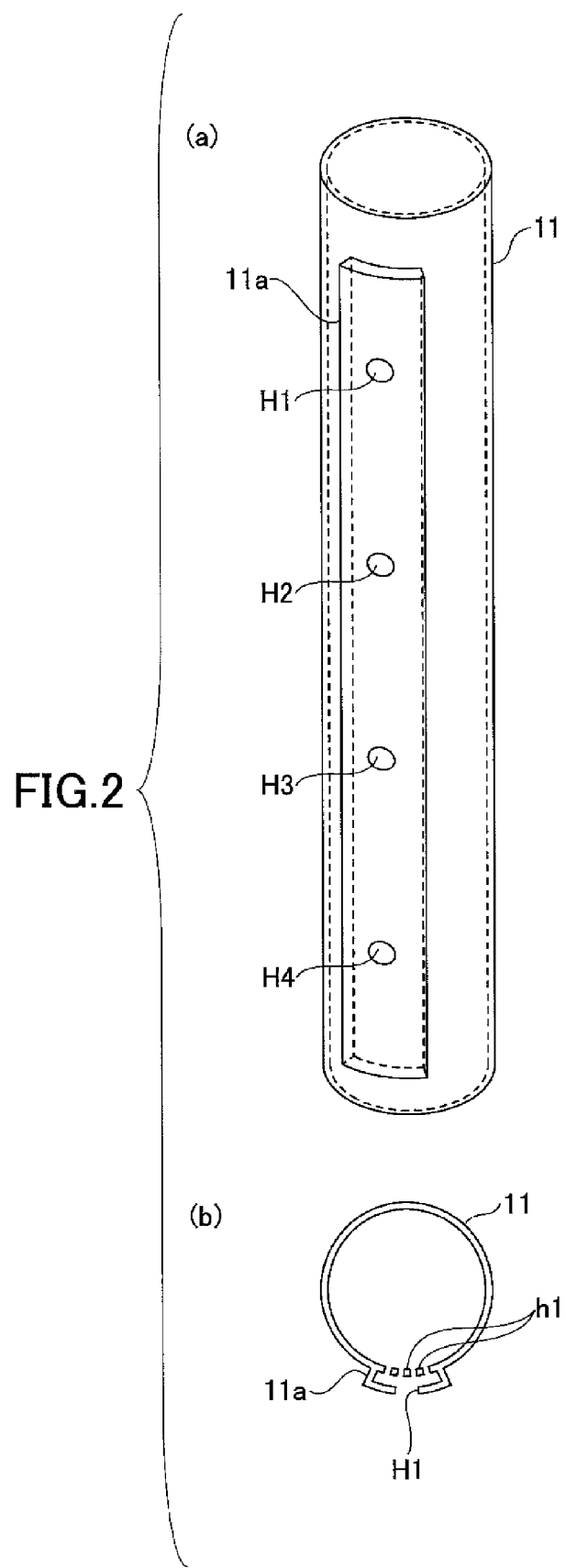
FIG. 2 is a schematic view of an inner tube of the thermal treatment apparatus of FIG. 1.

The inner tube 11 has a shape of a cylinder with a closed top and a bottom opening, as shown in Section (a) of FIG. 2, and may be made of, for example, quartz. In addition, an extension part 11a is attached on a part of a circumferential surface of the inner tube 11. The extension part 11a has a shape of a box that extends along the longitudinal direction of the inner tube 11, and thus creates a space in relation to the circumferential wall of the inner tube 11. In addition, plural (e.g., four in the illustrated example) gas supplying holes H1 to H4 are formed in a circumferential wall of the extension part 11a. The gas supplying holes E1 to H4 are arranged substantially in line along the longitudinal direction of the inner tube 11. The gas supplying holes H1 to H4 are formed corresponding to the gas supplying pipes 17a to 17d. In other words, the gas supplying pipes 17a to 17d are supported by the guide tubes 10a to 10d so that the opening ends of the gas supplying pipes 17a to 17d are in alignment with the corresponding gas supplying holes H1 to H4.

In addition, plural holes h1 are formed in a part of the circumferential wall of the inner tube 11, the part being covered with the extension part 11a, as shown in Section (b) of FIG. 2, so that the inner space of the extension part 11a can communicate with the inner space of the inner tube 11 through the plural holes h1. Therefore, the process gas from the gas supplying system flows into the inner space of the extension part 11a through the gas supplying pipes 17a to 17d and the gas supplying holes H1 to H4, and further into the inner space of the inner tube 11 through the plural holes h1. Incidentally, an inner diameter of the gas supplying holes H1 to H4 is preferably substantially the same as an inner diameter of the corresponding gas supplying pipes 17a to 17d. In addition, the inner diameter of the gas supplying holes H1 to H4 may be slightly larger than the inner diameter of the corresponding gas supplying pipes 17a to 17d so that the gas supplying pipes 17a to 17d can be inserted into the corresponding gas supplying holes H1 to H4.

Referring again to FIG. 1, the inner tube 11 is fixed on a pedestal 18 that has a top opening through which the wafer supporting member 16 can pass. The pedestal 18 is then supported by a supporting plate 12 that also has a top opening through which the wafer supporting member 16 can pass.

The wafer supporting member 16 has at least three pillars 16a. The pillars 16a are provided with plural notches at predetermined intervals, so that the wafer W is supported by the three notches formed at the same level in the corresponding pillars 16a. In this embodiment, the wafer supporting member 16 can support 117 wafers W. For example, the wafer supporting member 16 supports 4 dummy wafers, 25 production wafers, 3 dummy wafers, 25 production wafers, 3 dummy wafers, 25 production wafers, 3 dummy wafers, 25 production wafers, and another 4 dummy wafers from the top to the bottom of the wafer supporting member 16. In addition, the wafer supporting member 16 is arranged so that the process gas is supplied to the top 25 production wafers, the second top 25 production wafers W, the third top 25 production wafers, and the bottom 25 production wafers substantially from the gas supplying pipe 17a, the gas supplying pipe 17b, the gas supplying pipe 17c, and the gas supplying pipe 17d, respectively.

In addition, the wafer supporting member 16 is fixed on a support rod 19 that in turn is supported by a lid member 12a. The lid member 12a is brought upward and downward by an elevation mechanism (not shown), so that the supporting rod 19 and thus the wafer supporting member 16 are transferred into and out from the inner tube 11. When the wafer supporting member 16 is transferred into the inner tube 11, the lid member 12a comes in contact with a lower surface of the supporting plate 12 via a sealing member (not shown), thereby isolating an inner environment of the outer tube 10 from an outer environment.

Incidentally, the lid member 12a may have an opening that allows the supporting rod 19 to pass therethrough, and a clearance between the opening and the supporting rod 19 may be sealed with a magnetic fluid. With this configuration, the supporting rod 19 can be rotatable with a rotating mechanism (not shown).

As shown in FIG. 1, the heating part 20 includes a first heating part 21 that covers the circumferential wall of the outer tube 10 and a second heating part 22 that covers an upper end part of the first heating part 21.

Figure 3:
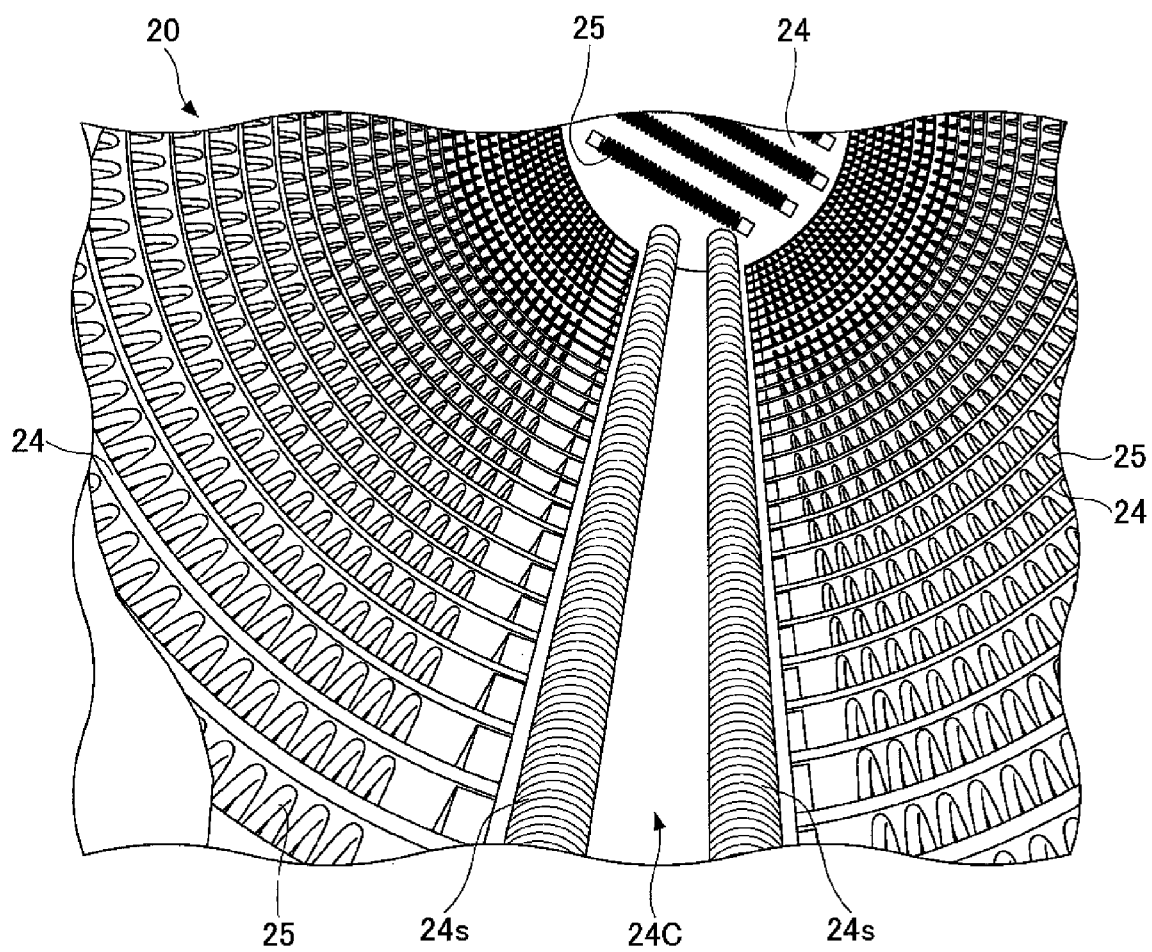
FIG. 3 is a schematic view illustrating an inner structure of a heating part of the thermal treatment apparatus of FIG. 1.

The first heating part 21 includes a cylindrical member 23 made of a metal, an insulating member 24 that is provided along an inner surface of the cylindrical member 23, and a heating element 25 supported by the insulating member 24 (see FIG. 3). In addition, an upper evacuation opening 22D is formed in the upper end part of the first heating part 21 in order to evacuate air provided into a space between the heating part 20 and the outer tube 10. An evacuation pipe (not shown) is connected to the upper evacuation opening 22D through which the air from the upper evacuation opening 22D can be evacuated to the outside. Moreover, plural feedthroughs 25a are provided in a circumferential wall of the cylindrical member 23. Electric power is supplied to the heating element 25 through the feedthroughs 25a.

FIG. 3 is a partial perspective view illustrating the inside of the heating part 20. As shown in FIG. 3, the insulating member 24 is provided with plural grooves that are vertically ordered. Using these grooves, the heating element 25 is accommodated. By arranging the heating element 25 in the form of shelves, the plural wafers W within the inner tube 11 can be uniformly heated. In addition, the heating element 25 is made of two separate heating wires, one of which is arranged in one of two zones into which the insulating member 24 is vertically divided, and the other of which is arranged in the other one of the two zones. With such arrangement, the heating wires of the heating element 25 are arranged in corresponding semicircular columns of the insulating member 24, and the semicircular columns are arranged on the inner surface of the cylindrical member 23, thereby easily assembling the first heating part 21.

Incidentally, the heating member 25 may have three or more heating wires, which in turn are arranged in corresponding zones defined in the insulating member 24 in a vertical direction. With this arrangement, a temperature uniformity of the wafers W within the outer tube 10 can be improved by controlling electrical power supplied to each of the heating wires.

Figure 4:
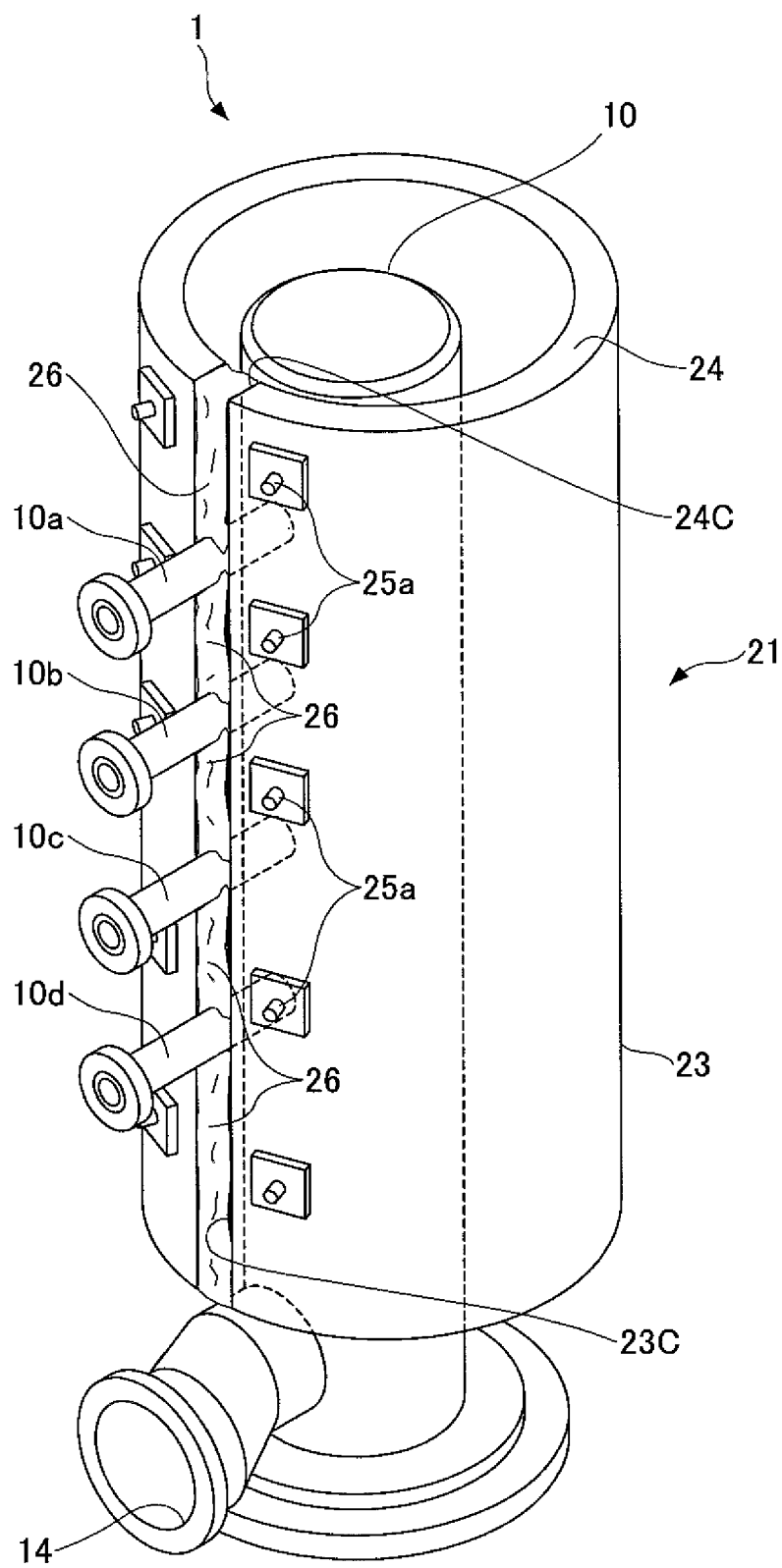
FIG. 4 is a schematic perspective view of the heating part and an outer tube of the thermal treatment apparatus of FIG. 1.

Referring to FIGS. 3 and 4, the first heating part 21 includes a slit that extends from a bottom part to a top part of the first heating part 21 and thus allows the guide tubes 10a to 10d of the outer tuber 10 to pass through. Specifically, the slit 23C is formed in a part of the cylindrical member 23 so that the slit 23C extends from a bottom part to a top part in a longitudinal direction of the cylindrical member 23. Corresponding to the slit 23C, a slit 24C is formed in a part of the insulating member 24 so that the slit 24C extends from a bottom part to a top part in a longitudinal direction of the insulating member 24. With the slits 23C, 24C, the first heating part 21 has a C-like top view shape. In addition, the entire inner surface of the first heating part 21, except for the slits 23C, 24C, faces the outer circumferential wall of the outer tube 10.

Figure 6:
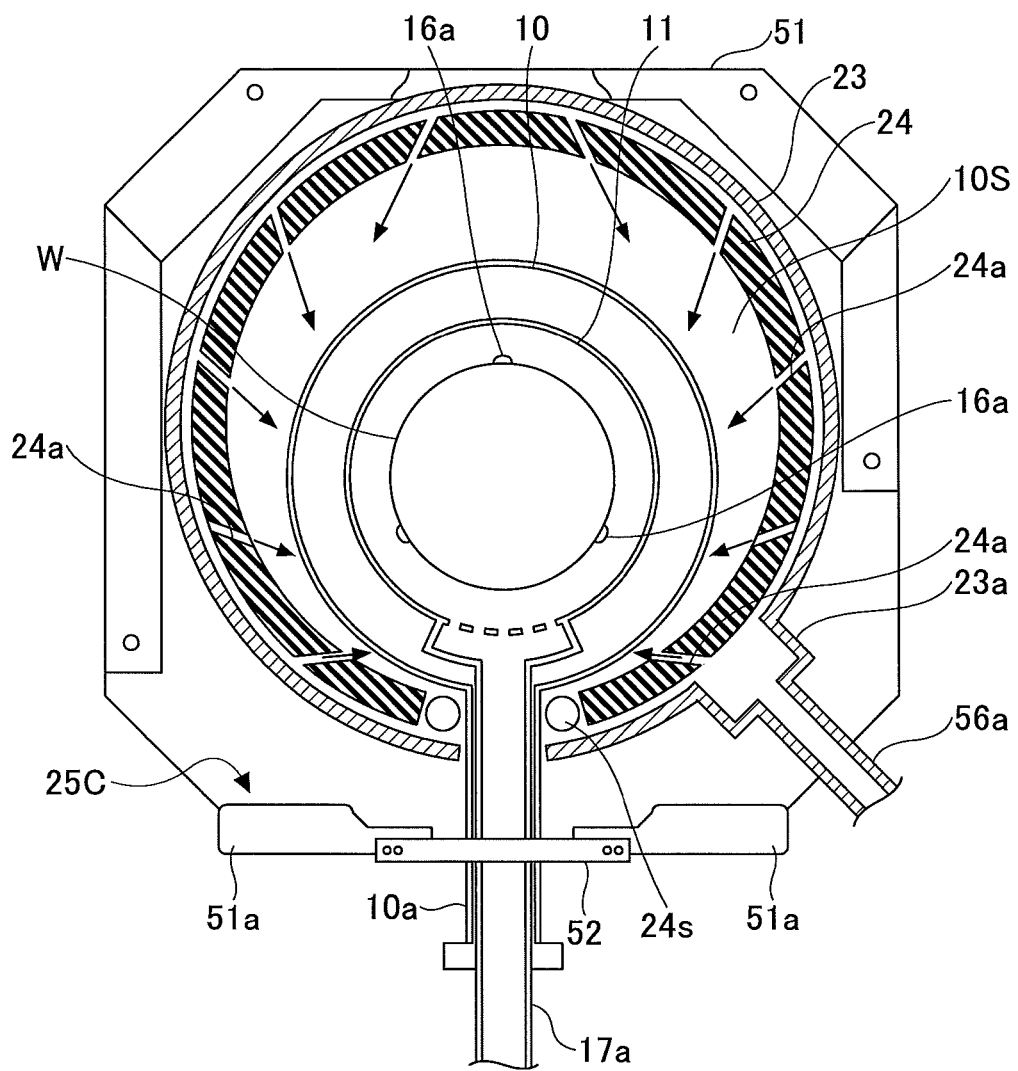
FIG. 6 is a schematic cross-sectional view illustrating the thermal treatment apparatus of FIG. 1.

As shown in FIGS. 1, 4, and 6, the outer tube 10 is eccentrically arranged in relation to the first heating part 21 so that the circumferential wall of the outer tube 10, the circumferential wall where the guide tubes 10a to 10d are attached, is closer to the inner surface of the first heating part 21. With such a configuration, a length of the guide tubes 10a to 10d and the gas supplying pipes 17a to 17d inside of the first heating part 21 can be decreased. In other words, the gas supplying pipes 17a to 17d do not extend for a long distance through a space in or inside of the first heating part 21, while the space is heated at relatively high temperatures by radiation from the heating element 25. Therefore, the gas supplying pipes 17a to 17d are not likely to be heated to the high temperatures, and thus the process gas within the gas supplying pipes 17a to 17d are not likely to be heated to high temperatures. Accordingly, even if the process gas has a relatively low decomposition temperature, the process gas can reach the wafers W without being decomposed.

On the other hand, because the slits 23C, 24C are formed in the first heating part 21, an amount of heat for heating the wafers W within the outer tube 10 from the first heating part 21 may be insufficient, which may lead to degradation of the temperature uniformity of the wafers W. In order to compensate for a potential lack of the heat amount, a third heating part 24s is provided along vertical edges of the slit 24C of the insulating member 24 in this embodiment as shown in FIG. 3. The third heating part 24s may be made of, for example, a ceramic rod, a heating wire that is wound around the ceramic rod, and an insulating member that covers the heating wire and the ceramic rod. By controlling electrical power supplied to the heating wire, a heating amount, which may be lacking because of the slits 23C, 24C, can be appropriately compensated for, so that the temperature uniformity of the wafers W is prevented from being degraded.

Figure 5:
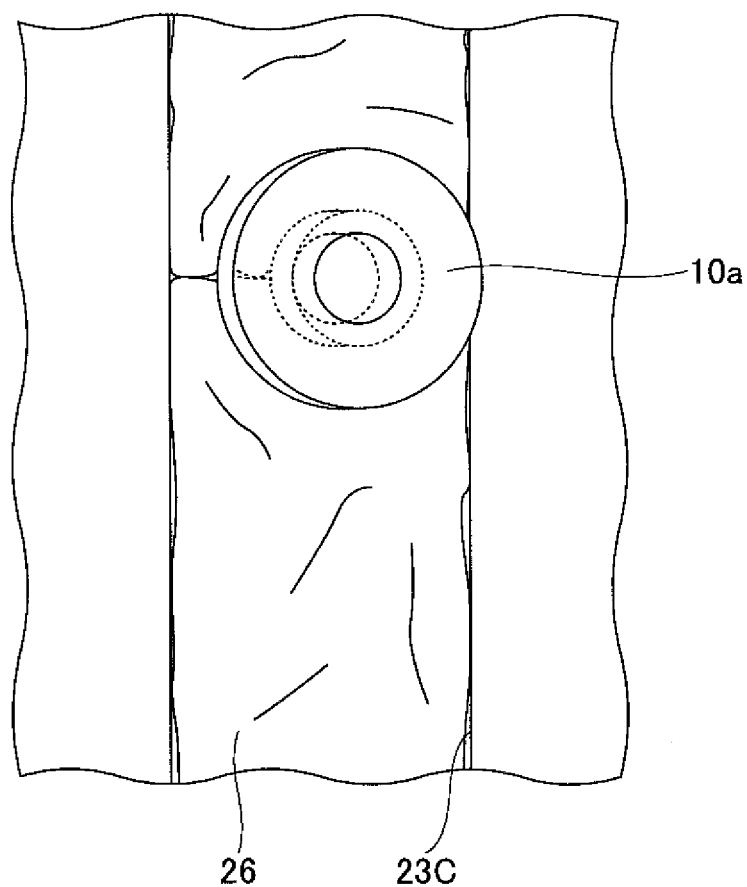
FIG. 5 is a schematic view of a thermal insulating member that fills a space between a slit made in the heating part and gas supplying pipes.

In addition, as shown in FIGS. 4 and 5, an insulating member 26 is provided in a space between the guide tubes 10a to 10d and the vertical edges of the slits 23C, 24C of the first heating part 21. The insulating member 26 may be configured of, for example, an outer cladding made of a silica glass fiber (or glass wool), and a silica glass fiber or silica glass powder crammed into the outer cladding. With this configuration, the insulating member 26 can be flexible and thus deformed depending on a shape of the space between the guide tubes 10a to 10d and the vertical edges of the slits 23C, 24C, so that the space can be filled without gaps. By using the insulating member 26, the heat inside the first heating part 21 is prevented from emanating outward, thereby improving thermal uniformity inside the first heating part 21.

Incidentally, when the electric power is supplied to the heating element 25 of the first heating part 21 thereby heating the wafers W, the first heating part 21 itself is heated to be thermally expanded by the heat generated by the heating element 25, and thus the widths of the silts 23C, 24C (or distance between the vertical edges of the slits 23C, 24C) may become greater. To avoid this, an outer cladding 51 is provided in order to hold the cylindrical member 23 of the first heating part 21 from outside, as shown in FIG. 6. The outer cladding 51 also has a slit 25C that allows the guide tubes 10a to 10d of the outer tube 10 to go therethrough, and attachment parts 51a are provided on opposing sides of the slit 25C. A connecting member 52 is provided to bridge the attachment parts 51a, according to which the first heating part 21 is held from outside by the outer cladding 51. Therefore, the first heating part 21 is prevented from being outwardly expanded.

Figure 7:
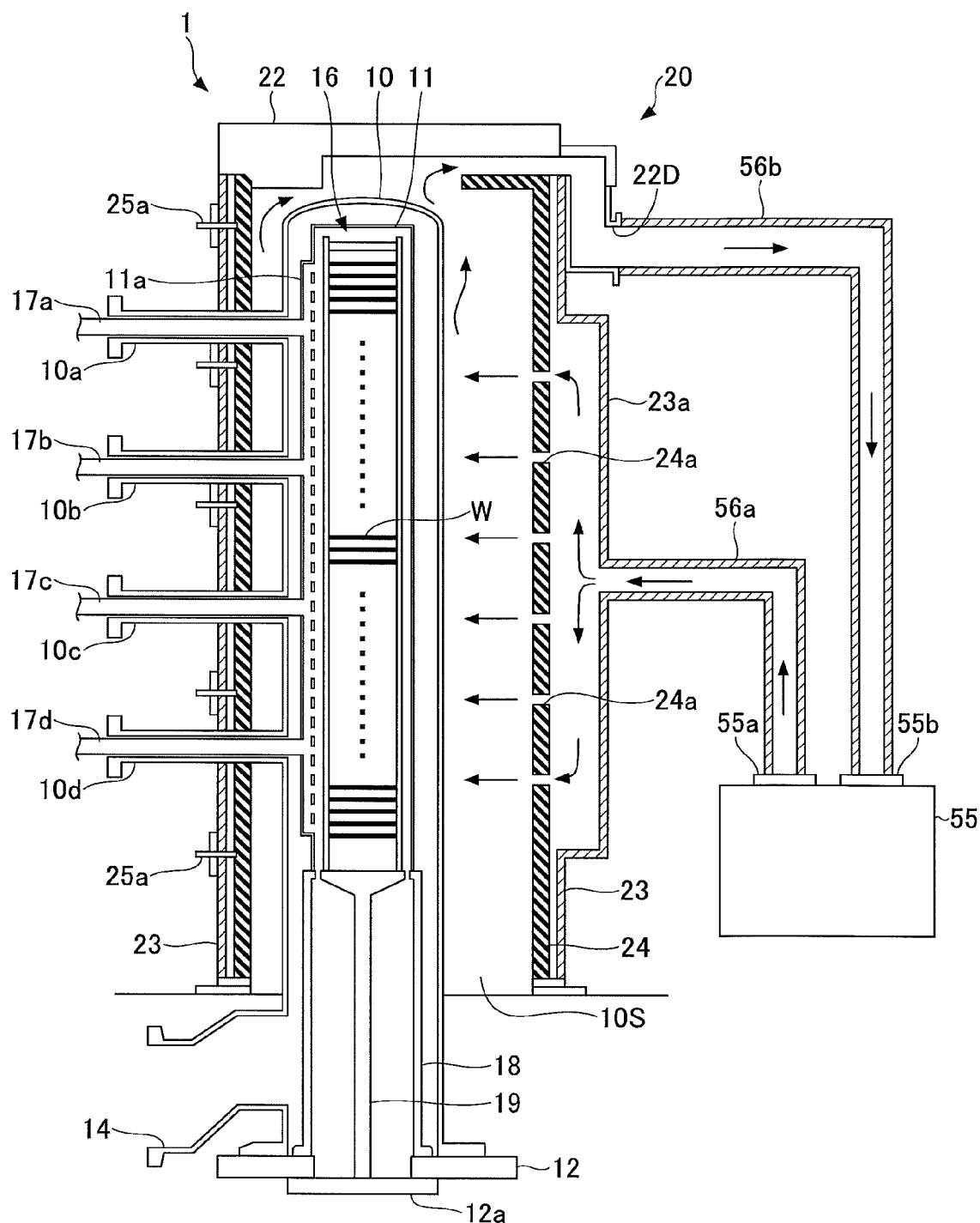
FIG. 7 is a schematic view illustrating an air circulating mechanism of the thermal treatment apparatus of FIG. 1.

Referring to FIG. 6, the first heating part 21 is provided with plural conduits 24a that orthogonally go through the insulating member 24 (or slanted with respect to the radius direction of the insulating member 24). In addition, the conduits 24a are arranged along the longitudinal direction of the insulating member 24 at predetermined intervals, as shown in FIG. 7. Incidentally, although ten conduits 24a are illustrated in FIG. 10, the number of the conduits 24a in both the circumferential and the longitudinal directions of the insulating member 24a is not limited to those illustrated in FIGS. 6 and 7, but may be arbitrarily determined.

In addition, as shown in FIGS. 6 and 7, a part of the circumferential wall of the cylindrical member 23 is cut out in a longitudinal direction of the cylindrical part 23, and a chamber 23a is provided in the cutout part. A blower pipe 56a is connected on one side to the chamber 23a and on the other side to an outlet opening 55a of a blower 55, as shown in FIG.

7. In addition, a blower pipe 56b is connected on one side to an inlet opening 55b of the blower 55 and on the other side to the upper evacuation opening 22D. With this, air is supplied to the space between the cylindrical member 23 and the insulating member 24 (or the space within the chamber 23a), and then blown toward the outer tube 10 through the conduits 24a. Therefore, the outer tube 10 and thus the wafers W can be efficiently cooled by blowing the air to the outer tube 10 when the outer tube 10 and the wafers W need to be cooled after the treatment to the wafers W is completed. In addition, the air is blown out from the conduits 24a in the slanted direction with respect to the circumferential surface of the outer tube 10 (FIG. 6), so that the circumferential surface of the outer tube 10 can be uniformly cooled rather than locally cooled.

Moreover, the conduits 24a are directed toward a dwindling space 10S where a distance between the outer tube 10 and the insulating member 24 becomes narrower forward, so that the air is blown to the dwindling space 10S where the air tends to be stagnant. Therefore, the outer tube 10 is more likely to be uniformly cooled.

In addition, the air blown to the outer tube 10 returns to the blower 55 through the upper evacuation opening 22D, and then blown by the blower 55 to the outer tube 10. With such circulation, an amount of air evacuated from the thermal treatment apparatus 1 can be reduced, thereby reducing a burden on factory facilities.

Incidentally, the second heating part 22 includes another set of the insulating member 24 and the heating element 25, as shown in FIG. 3. Electric power is supplied to the heating element 25 of the second heating part 22 through another set of the feedthroughs (not shown), and then a temperature of the heating element 25 can be controlled.

Figure 8:
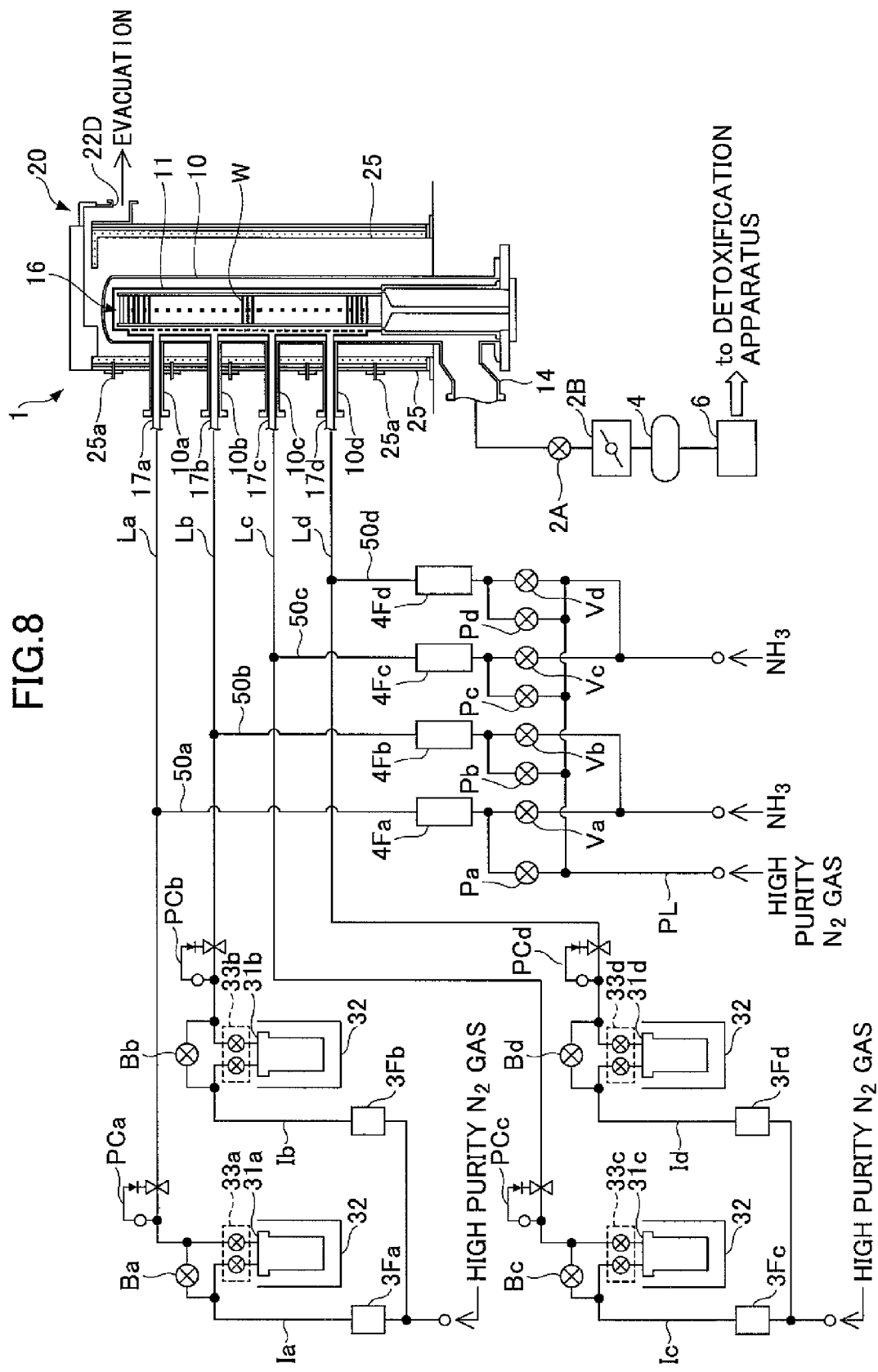
FIG. 8 is a schematic diagram of the thermal treatment apparatus of FIG. 1, which serves as a film deposition apparatus.

Next, a gallium nitride (GaN) film deposition onto a sapphire wafer is explained as an example of the thermal treatment that can be carried out in the thermal treatment apparatus 1 according to this embodiment of the present invention, with reference to FIG. 8.

As shown in FIG. 8, gallium source cylinders 31a to 31d are connected to the corresponding gas supplying pipes 17a to 17d via pipes La to Ld. The gallium source cylinders 31a to 31d may be so-called "bubblers" in which trimethylgallium (TMGa), which is a liquid metal-organic source material of gallium, is stored. In addition, the gallium source cylinders 31a to 31d are connected to corresponding carrier gas supplying sources via pipes Ia to Id where flow rate controllers (for example, mass flow controllers) 3Fa to 3Fd are provided, respectively. As the carrier gas, high purity nitrogen gas can be used. In the pipes La to Ld and the pipes Ia to Id, combination valves 33a to 33d are provided near the corresponding gallium source cylinders 31a to 31d. Each of the combination valves 33a to 33d includes two open/close valves that are opened or closed in unison. In addition, bypass lines are provided in order to connect the pipes La to Ld with the corresponding pipes Ia to Id, and include corresponding bypass valves Ba to Bd. When the bypass valves Ba to Bd are opened and the combination valves 33a to 33d are closed, the carrier gas can flow through the bypass lines to the corresponding gas supplying pipes 17a to 17d and then to the outer tube 10. On the contrary, when the bypass valves Ba to Ed are closed and the combinations valves 33a to 33d are opened, the carrier gas flows into the corresponding gallium source cylinders 31a to 31d and ejected into the TMGa inside the corresponding gallium source cylinders 31a to 31d. Then, the carrier gas, which now contains TMGa vapor or gas, flows through the gas supplying pipes 17a to 17d to the outer tube 10.

In addition, each of the gallium source cylinders 31a to 31d is provided with a temperature controlling bath 32 by which the gallium source cylinders 31a to 31d and the TMGa in the gallium source cylinders 31a to 31d are temperature-controlled by a temperature controller (not shown). With this, a vapor pressure of the TMGa can be maintained constant depending on the temperature of the TMGa. In this case, a carrier gas pressure within the pipes La to Ld can be controlled at constant by corresponding pressure controllers PCa to PCd provided in the corresponding pipes La to Ld, so that a TMGa concentration within the carrier gas flowing through the pipes La to Ld can be maintained constant.

In addition, pipes 50a to 50d, which are connected to, for example, an ammonia gas source, are merged into the corresponding pipes La to Ld. The pipes 50a to 50d are provided with corresponding flow rate controllers (for example, mass flow controllers) 4Fa to 4Fd and corresponding valves Va to Vd. When the open/close valves Va to Vd are opened, the ammonia ($NH_3$) gas from the ammonia gas source flows at flow rates controlled by the flow rate controllers 4Fa to 4Fd into the corresponding pipes La to Ld through the corresponding pipes 50a to 50d. With this, a mixed gas of the carrier gas containing the TMGa vapor or gas and the $NH_3$ gas is supplied to the inner tube 11 through the gas supplying pipes 17a to 17d.

In addition, a purge gas supplying pipe PL is provided to be connected to a purge gas supplying source (not shown). As a purge gas, high purity nitrogen gas is used in this embodiment. The purge gas supplying pipe PL is connected to the pipe 50a between the flow rate controller 4Fa and the open/close valve Va via an open/close valve Pa; to the pipe 50b between the flow rate controller 4Fb and the open/close valve Vb via an open/close valve Pb; to the pipe 50c between the flow rate controller 4Fc and the open/close valve Vc via an open/close valve Pc; and to the pipe 50d between the flow rate controller 4Fd and the open/close valve Vd via an open/close valve Pd.

In addition, the evacuation tube 14 of the outer tube 10 is connected to a pump 4 (for example, a mechanical booster pump) and a pump 6 (for example, a dry pump) via a main valve 2A and a pressure controller 2B. With this configuration, the outer tube 10 can be evacuated at a predetermined pressure. In addition, the evacuated gas (the carrier gas, the TMGa vapor or gas, the $NH_3$ gas, and the purge gas) are guided from the pump 6 to a predetermined detoxicating facility. The evacuated gas is detoxicated in the facility and released to an atmosphere.

In the above configuration, a GaN film may be deposited on the sapphire wafer in the following procedures. First, the wafer supporting member 16 is transferred down from the outer tube 10 by the elevation mechanism (not shown), and the plural sapphire wafers having, for example, a diameter of 4 inches are loaded to the wafer supporting member 16 by a wafer loader (not shown). Next, the wafer supporting member 16 is transferred into the outer tube 10 by the elevation mechanism, and the outer tube 10 is closed in an air-tight manner by making the supporting plate 12 come in contact with the lower end of the outer tube 10 via the sealing member (not shown).

Then, the outer tube 10 is evacuated to a predetermined pressure by the pumps 4, 6. When the bypass valves Ba to Bd are opened, the combination valve 33a to 33d are closed, and the nitrogen gas is supplied from the carrier gas source, the nitrogen gas flows at a controlled flow rate through the pipes Ia to Id and the bypass valves Ba to Bd to the pipes La to Ld. The nitrogen gas then flows into the inner tube 11 through the gas supplying pipes 17a to 17d. In addition, when the open/ close valves Pa to Pd are opened while the open/close valves Va to Vd are closed, the nitrogen gas flows at a controlled flow rate to the pipes La to Ld through the pipes 50a to 50d, and then to the inner tube 11 through the gas supplying pipes 17a to 17d.

By allowing the nitrogen gas to flow into the inner tube 11, the inner tube 11 is purged with the nitrogen gas. By controlling electric power supplied to the heating part 20 (the first heating part 21 and the second heating part 22), the sapphire wafers W supported by the wafer supporting member 16 are heated at a predetermined temperature (for example, 850° C. to 1000° C.). A temperature of the sapphire wafers W is measured by one or plural thermocouples arranged along the longitudinal direction of the wafer supporting member 16, and controlled to be constant based on the measured temperature.

After the inner tube 11 is fully purged and a temperature of the sapphire wafers W is stabilized at the predetermined temperature, film deposition of GaN is started. Specifically, the open/close valves Va to Vd are opened and the open/close valves Pa to Pd are closed, so that the $NH_3$ gas starts flowing into the inner tube 11 at a flow rate controlled by the corresponding flow rate controllers 4Fa to 4Fd. With this $NH_3$ gas, a nitrogen gas environment is changed to a $NH_3$ gas environment inside the inner tube 10. In addition, the $NH_3$ gas is thermally decomposed by the heat of the sapphire wafers W. At this time, the upper surfaces of the sapphire wafers W become azotized by nitrogen atoms generated from the decomposed $NH_3$ gas. After a predetermined period of time has passed and thus a $NH_3$ gas concentration becomes constant inside the inner tube 11, or the $NH_3$ gas concentration becomes the same as that in the $NH_3$ gas source, the combination valves 33a to 33d are opened and the bypass valves Ba to Bd are closed. With these valve operations, the nitrogen gas is supplied at a flow rate controlled by the flow rate controllers 3Fa to 3Fd into the corresponding gallium source cylinders 31a to 31d. Then, the nitrogen gas, which now contains the TMGa vapor (or gas), flows through the pipes La to Ld and the gas supplying pipes 17a to 17d into the inner tube 11. The TMGa vapor (or gas) supplied into the inner tube 11 is thermally decomposed by the heat of the sapphire wafers W, and thus gallium atoms produced from the thermally decomposed TMGa vapor (or gas) and the nitrogen atoms produced from the thermally decomposed $NH_3$ gas react with each other, so that the GaN film is deposited on the sapphire wafers W.

According to this embodiment, the inner tube 11 is provided in the circumferential wall with the gas supplying pipes 17a to 14d, and the process gas (the mixed gas of the TMGa vapor (or gas), the carrier gas, and the $NH_3$ gas in this embodiment) is supplied into the inner tube 11 through the gas supplying pipes 17a to 17d. If a gas supplying nozzle that has plural gas ejection holes at predetermined intervals along a longitudinal direction of the gas supplying nozzle extends within an inner tube and a process gas is supplied to wafers supported by a wafer supporting member, the process gas is supplied to the wafers at different temperatures along the longitudinal direction of the gas supplying nozzle because the process gas is heated at higher temperatures near a top end part of the gas supplying nozzle. However, according to this embodiment, the process gas does not flow along the longitudinal direction of the inner tube 10 but is supplied to the wafers supported by the wafer supporting member 16 from the gas supplying pipes 17a to 17d provided in the circumferential wall of the inner tube 11. Therefore, the process gas can be supplied to the wafers at substantially the same temperature along the longitudinal direction of the inner tube 11, thereby maintaining wafer-to-wafer thermal treatment uniformity.

In addition, the process gas may be thermally decomposed if it flows upward along the longitudinal direction of the inner tube. However, the process gas can be supplied to the wafers without being decomposed when it is supplied to the wafers from the gas supplying pipes 17a to 17d provided in the circumferential wall of the inner tube 11, but may only be decomposed substantially by the heat of the wafers W supported by the wafer supporting member 16. Therefore, usage efficiency of the process gas is improved.

Specifically, in the case of the GaN film deposition employing the TMGa and the $NH_3$ gas, if the TMGa and the $NH_3$ gas are supplied from the gas supplying nozzle that extends along the longitudinal direction of the inner tube, the TMGa having a significantly low decomposition temperature compared to that of the $NH_3$ gas is thermally decomposed in a gas phase in the gas supplying nozzle, so that gallium may be precipitated on the inner surface of the gas supplying nozzle. In this case, a film deposition rate onto the wafers may be reduced, and the precipitated Ga may serve as a particle source thereby contaminating the wafers. However, according to this embodiment of the present invention, the TMGa and the $NH_3$ gas do not flow through the outer tube 10 and the inner tube 11 for a long distance, but can readily reach the wafers from the gas supplying pipes 17a to 14d, so that thermal decomposition of the TMGa is suppressed, thereby avoiding a reduction of the film deposition rate and suppressing precipitation of Ga.

In addition, as shown in FIGS. 1, 4, and 6, the outer tube 10 is eccentrically arranged in relation to the first heating part 21, and a length of the gas supplying pipes 17a to 17d existing inside the first heating part 21 can be kept as short as possible. Therefore, the gas supplying pipes 17a to 17d is not likely to be heated to high temperatures, thereby suppressing thermal decomposition of the TMGa.

While the present invention has been described in reference to the foregoing embodiments, the present invention is not limited to the disclosed embodiments, but may be modified or altered within the scope of the accompanying claims.

For example, while the GaN film deposition using the thermal treatment apparatus 1 is explained, the thermal treatment apparatus 1 may be used to deposit a silicon nitride film on a silicon wafer using a dichlorosilane (DCS) gas and $NH_3$ gas as source gases, or to deposit poly silicon film on the silicon wafer using a silane ($SiH_4$) gas as a source gas. In addition, the thermal treatment apparatus 1 may be used not only for a film deposition process but also for a thermal oxidation process of the silicon wafer.

In addition, as a gallium source material to be used to deposit the GaN film, other metal-organic materials such as triethyl gallium (TEGa), may be used rather than TMGa. Alternatively, gallium chloride (GaCl) may be used as a gallium source material. Moreover, alkyl indium such as trimethyl indium may be used in addition to alkyl gallium. In this case, a source cylinder that is filled with the alkyl indium is provided in parallel with the gallium source cylinder 31a to 31d, and the carrier gas containing vapor or gas of the alkyl indium may be mixed with the carrier gas containing vapor or gas of the alkyl gallium, so that the mixed gas is supplied to the inner tube 11. With this configuration, an indium gallium nitride (InGaN) film can be deposited.

In addition, in order to suppress thermal decomposition of the alkyl gallium (and/or the alkyl indium), the guide tubes 10a to 10d may be configured of double pipes having two quartz pipes concentrically arranged with each other. In other words, the guide tubes 10a to 10d may be provided with a jacket surrounding the corresponding guide tubes 10 to 10d. In this case, the gas supplying pipes 17a to 17d are inserted through the corresponding inner pipes of the double pipes, and a cooling fluid is flowed through a space between the inner and the outer pipes of the double pipes, thereby cooling the guide tubes 10a to 10d.

Moreover, while the evacuation tube 14 is arranged below the guide tube 10d in the above embodiment, the evacuation tube 14 may be arranged in some other place except for a position opposing the guide tubes 10a to 10d of the outer tube 10. Specifically, the evacuation tube 14 may be arranged in a place on the side of the position opposing the guide tubes 10a to 10d, or a place above a position opposing to the guide tube 10a, or a place below a position opposing to the guide tube 10d. When the evacuation tube 14 is arranged in a place on the side of the position opposing the guide tubes 10a to 10d, two evacuation tubes 14 may be arranged with the position opposing the guide tubes 10a to 10d therebetween. Alternatively, plural evacuation tubes 14 may be arranged in places on the side of the position opposing the guide tubes 10a to 10d, in order to correspond to the guide pipes 10a to 10d.

The first heating part 21 has a shape of substantially a circular cylinder having the slits 23C, 24C in the above embodiment. In other embodiments, the first heating part 21 may have a shape of a polygonal cylinder. In this case, it is preferable that the slits 23C, 24C are made along a side of the polygonal cylinder.

In addition, a gas introduction pipe may be provided in order to vertically extend along the wafer supporting member 16, and may be used along with the gas supplying pipes 17a to 17d. In this case, a process gas having a high decomposition temperature is supplied through the gas introduction pipe, while another process gas having a low decomposition temperature is supplied through the gas supplying pipes 17a to 17d. With this method of supplying the process gases, the process gas having a high decomposition temperature can be sufficiently heated thereby reaching the wafers, while the process gas having the low decomposition temperature is prevented from being thermally decomposed before reaching the wafers. Namely, the process gases are supplied in a preferable manner depending on the decomposition temperatures.

What is claimed is:

1. A thermal treatment apparatus comprising:
    a supporting member where plural substrates are supported in the form of shelves;
    a reaction tube that accommodates the supporting member within the reaction tube, and is provided with plural gas supplying pipes arranged in a side part of the reaction tube, thereby allowing a gas to flow into the reaction tube through the plural gas supplying pipes; and
    a first heating part that heats the plural substrates supported by the supporting member accommodated within the reaction tube, the first heating part accommodating therein the reaction tube, wherein the first heating part includes a slit that extends from a bottom end to a top end of the first heating part and allows the plural gas supplying pipes to go therethrough, and wherein an entire inner surface of the heating part, except for the slit, faces the side part of the reaction tube,
    wherein the reaction tube has a shape of a cylinder extending in a first direction with a closed top and a bottom opening,
    wherein the first heating part has a shape of a cylinder extending in the first direction, and
    wherein the reaction tube is arranged eccentrically with regard to the first heating part, when viewed from the first direction, such that a sidewall surface of the reaction tube facing the slit comes closer to the first heating part than other part of the sidewall surface, the reaction tube being arranged eccentrically with regard to the first heating part such that a center of the reaction tube is offset, when viewed from the first direction, with regard to a center of the first heating part in a direction toward the slit.

2. The thermal treatment apparatus of claim 1, further comprising a second heating part provided along edges of the slit of the first heating part.

3. The thermal treatment apparatus of claim 1, further comprising a thermal insulating member arranged to fill a space between edges of the slit and the plural gas supplying pipes that go through the slit of the heating part.

4. The thermal treatment apparatus of claim 1, wherein the plural gas supplying pipes are arranged in a longitudinal direction of the reaction tube.

5. The thermal treatment apparatus of claim 1, further comprising a third heating part arranged at a top end of the first heating part.

6. The thermal treatment apparatus of claim 1, further comprising a chamber provided outside of the first heating part to extend in an elongating direction of the first heating part, the first heating part being provided with air passages, the thermal treatment apparatus further comprising a blower supplying an air into the chamber such that the air is supplied from the chamber to a space between the reaction tube and first heating part via the air passages in the first heating part.

7. The thermal treatment apparatus of claim 6, wherein the air passages supply the air to the space such that the air hits the reaction tube in a direction oblique to a surface of the reaction tube.

* * * * *